United States Patent
Maruthamuthu et al.

(10) Patent No.: US 9,819,327 B2
(45) Date of Patent: Nov. 14, 2017

(54) BULK ACOUSTIC WAVE RESONATOR TUNER CIRCUITS

(71) Applicants: Saravana Maruthamuthu, Munich (DE); Thorsten Meyer, Regensburg (DE); Pablo Herrero, Munich (DE); Andreas Wolter, Regensburg (DE); Georg Seidemann, Landshut (DE); Mikael Knudsen, Gistrup (DK); Pauli Jaervinen, Wallerfing (DE)

(72) Inventors: Saravana Maruthamuthu, Munich (DE); Thorsten Meyer, Regensburg (DE); Pablo Herrero, Munich (DE); Andreas Wolter, Regensburg (DE); Georg Seidemann, Landshut (DE); Mikael Knudsen, Gistrup (DK); Pauli Jaervinen, Wallerfing (DE)

(73) Assignee: INTEL IP CORPORATION, Santa Clara, CA (US)

( * ) Notice: Subject to any disclaimer, the term of this patent is extended or adjusted under 35 U.S.C. 154(b) by 397 days.

(21) Appl. No.: 14/398,049

(22) PCT Filed: Jun. 26, 2013

(86) PCT No.: PCT/US2013/047993
§ 371 (c)(1),
(2) Date: Oct. 30, 2014

(87) PCT Pub. No.: WO2014/209307
PCT Pub. Date: Dec. 31, 2014

(65) Prior Publication Data
US 2015/0333401 A1    Nov. 19, 2015

(51) Int. Cl.
*H03H 7/40*    (2006.01)
*H03H 9/00*    (2006.01)
(Continued)

(52) U.S. Cl.
CPC .......... *H03H 9/0014* (2013.01); *H01Q 5/335* (2015.01); *H03H 7/40* (2013.01); *H04B 1/0458* (2013.01)

(58) Field of Classification Search
CPC .... H01Q 5/335; H04B 1/0458; H03H 9/0004; H03H 9/0014; H03H 7/38; H03H 7/40; H03H 2007/386
(Continued)

(56) References Cited

U.S. PATENT DOCUMENTS 5,166,646 A * 11/1992 Avanic .................. H03B 5/326
                                                                257/312
5,446,306 A *  8/1995 Stokes ............... H03H 9/02102
                                                                257/416
(Continued)

FOREIGN PATENT DOCUMENTS

CN    102474294 A    5/2012
JP    2003023363 A1  1/2003
(Continued)

OTHER PUBLICATIONS

Office Action dated Jul. 20, 2016 for TW Patent Application No. 103118254, 2 pages.
(Continued)

*Primary Examiner* — Barbara Summons
(74) *Attorney, Agent, or Firm* — Schwabe, Williamson & Wyatt, P.C.

(57) ABSTRACT

Techniques and configurations are disclosed for bulk acoustic wave resonator (BAWR) tuner circuits and their use in integrated circuit (IC) packages and mobile communication devices for radio frequency (RF) communication. In some embodiments, a mobile communication device may include an antenna; a transmitter circuit having an output port, a tuner circuit having one or more BAWRs, an antenna port
(Continued)

coupled to the antenna, a transmitter port coupled to the output port of the transmitter circuit, and a control port; and a control circuit, coupled to the control port, configured to adjust an impedance of the tuner circuit, via adjustment of a BAWR or another component of the tuner circuit, based at least in part on an impedance of the antenna. Other embodiments may be described and/or claimed.

22 Claims, 9 Drawing Sheets

(51) Int. Cl.
*H04B 1/04* (2006.01)
*H01Q 5/335* (2015.01)

(58) Field of Classification Search
USPC .................. 333/17.3, 187, 188, 189, 133
See application file for complete search history.

(56) References Cited

U.S. PATENT DOCUMENTS

| | | | | |
|---|---|---|---|---|
| 5,714,917 | A * | 2/1998 | Ella ................ | H03C 1/46 310/318 |
| 5,973,568 | A * | 10/1999 | Shapiro ............ | H03F 3/602 330/295 |
| 6,064,868 | A | 5/2000 | Kobayashi | |
| 7,339,445 | B2 | 3/2008 | Aigner et al. | |
| 7,573,350 | B2 * | 8/2009 | Frank ............... | H03F 1/223 333/187 |
| 7,728,696 | B2 * | 6/2010 | Stuebing .......... | H03H 9/54 330/302 |
| 7,986,198 | B2 * | 7/2011 | Nakatsuka ........ | H03H 9/132 310/322 |
| 9,281,798 | B2 * | 3/2016 | David .............. | H03H 9/02031 |
| 2003/0008617 | A1 | 1/2003 | Tamaru et al. | |
| 2003/0076168 | A1 | 4/2003 | Forrester | |
| 2007/0205849 | A1 * | 9/2007 | Otis ................ | H03H 9/545 333/187 |
| 2008/0186105 | A1 * | 8/2008 | Scuderi ............ | H03H 7/40 333/17.3 |
| 2009/0096533 | A1 * | 4/2009 | Paul ................ | H03F 1/56 330/305 |
| 2010/0022197 | A1 | 1/2010 | Kato et al. | |
| 2011/0241800 | A1 | 10/2011 | Yokoyama | |
| 2012/0007666 | A1 | 1/2012 | David et al. | |
| 2012/0119971 | A1 | 5/2012 | Bae | |
| 2013/0069737 | A1 | 3/2013 | See et al. | |
| 2014/0340173 | A1 * | 11/2014 | Burgener .......... | H01Q 1/50 333/188 |

FOREIGN PATENT DOCUMENTS

| | | |
|---|---|---|
| JP | 2009164990 A | 7/2009 |
| KR | 20080025814 A | 3/2008 |
| KR | 20110017107 A | 2/2011 |
| WO | WO 2004/093315 A1 * | 10/2004 |

OTHER PUBLICATIONS

Office Action dated Dec. 6, 2016 for Japanese Patent Application No. 2016-521390, 3 pages.
German Office Action for Application No. 11 2013 002 919.7; dated Jul. 7, 2015; 16 pages (4 pages of English translation; 12 pages of German Action).
International Search Report and Written Opinion dated Mar. 17, 2014 from International Application No. PCT/US2013/047993.
Kerherve, Eric, "BAW Technologies for Radiofrequency Filters and Duplexers", Montreal, Nov. 2, 2011, 89 pages.
Mahon, Steven, et al., "Bulk Acoustic Wave Devices—Why, How, and Where They are Going", CS Mantech Conference, May 14-17, 2007, Austin, Texas, USA, 4 pages.
Marksteiner, S., et al., "A Miniature BAW Duplexer using Flip-Chip on LTCC", IEEE Ultrasonics Symposium-1794, 2003, 4 pages.
Reinke, John R., "CMOS-MEMS Variable Capacitors for Reconfigurable RF Circuits", Submitted in partial fulfillment of the requirements for the degree of Doctor of Philosophy in Electrical and Computer Engineering, Carnegie Mellon University, Pittsburgh, PA, May, 2011, 179 pages.
Sis, Seyit Ahmet, et al., "A DC Voltage Dependent Switchable Acoustically Coupled BAW Filter Based on BST-on-Silicon Composite Structure", Department of Electrical Engineering and Computer Science, University of Michigan, Ann Arbor, MI, USA, 3 pages.
Dubois, Marc-Alexandre, "Thin film bulk acoustic wave resonators: a technology overview", Memswave 03, Toulouse, France, Jul. 2-4, 2003, 4 pages.
Goldsmith, Charles L., et al., "RF MEMs Variable Capacitors for Tunable Filters", Ratheon Systems Corporation, received Jul. 27, 2008 and revised Dec. 30, 1998, Dallas, Texas, USA, 13 pages.
Kozyrev, A.B., et al., "Electronically switchable bulk acoustic wave resonator based on paraelectric state ferroelectric films", Electronic Letters, Nov. 24, 2011, vol. 47, No. 24, 2 pages.
Wispry, "Digital Capacitor Array for LTE Front End Tuners and General Applications", Data Sheet, Version 1.5, WiSpry Inc., Irvine, CA, 24 pages.
Sahmimi, Maher, Reverse Costing Analysis-Wispry RF MEMS Antenna Tuner, System Plus Consulting, Nantes Cedex 3, France, Jan. 2012, 10 pages.
Office Action dated May 12, 2017 for TW Patent Application No. 103118254, 2 pages.

* cited by examiner

BULK ACOUSTIC WAVE RESONATOR TUNER CIRCUITS

CROSS-REFERENCE TO RELATED APPLICATION

The present application is a national phase entry under 35 U.S.C. §371 of International Application No. PCT/US13/047993, filed Jun. 26, 2013, entitled "BULK ACOUSTIC WAVE RESONATOR TUNER CIRCUITS", which designates the United States of America, the entire disclosure of which is hereby incorporated by reference in its entirety.

FIELD

Embodiments of the present disclosure generally relate to the field of integrated circuits, and more particularly, to techniques and configurations associated with using bulk acoustic wave resonator tuner circuits for radio frequency (RF) communication.

BACKGROUND

Many mobile communication devices support transmit and receive operations over multiple frequency bands, but performance of these devices is often compromised by power loss due to mismatches between components under various operating conditions. For example, in order to limit radio frequency (RF) energy loss, discrete impedance tuner circuits are often included between an antenna and other front-end circuitry of the mobile communication device to match the impedance of the antenna to the impedance of the front-end circuitry. Such tuners occupy significant space on a printed circuit board within the mobile communication device, and may cause excess power dissipation due to insertion loss and low quality factors in some frequency bands. Some mobile communication devices also include DC-DC converters between a power amplifier and an antenna that are used to adjust the voltage supplied to the power amplifier in order to adjust the power of the RF signal generated by the antenna (e.g., increasing the power when the mobile communication device moves away from a base station). However, DC-DC converters may be costly, and may introduce a high level of noise that may affect the performance of the mobile communication device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
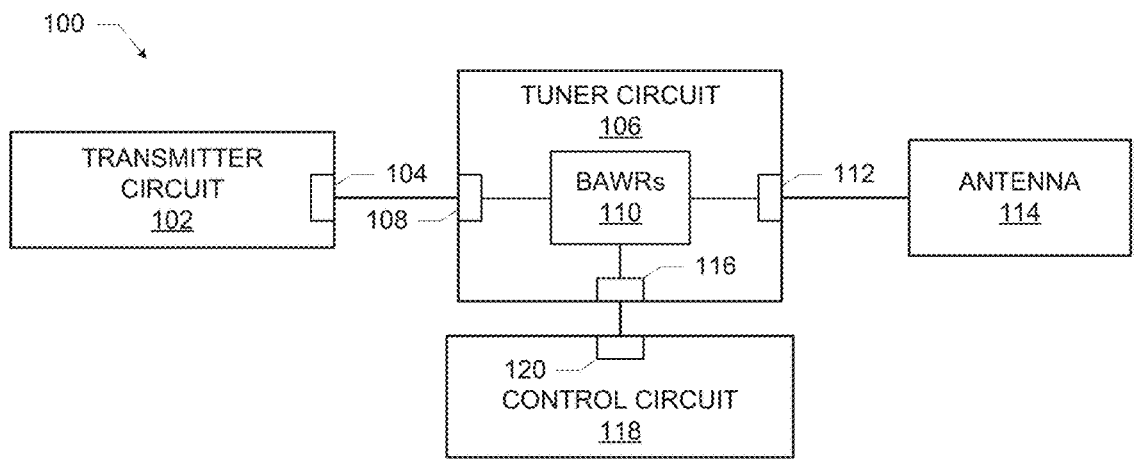
FIG. 1 schematically illustrates a radio frequency (RF) communication circuit having a tuner circuit including one or more bulk acoustic wave resonators (BAWRs), in accordance with some embodiments.

Embodiments of the present disclosure describe techniques and configurations for bulk acoustic wave resonator (BAWR) tuner circuits and their use for impedance matching in integrated circuit (IC) packages and mobile communication devices for radio frequency (RF) communication. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

FIG. 1 schematically illustrates an RF communication circuit 100, which may include a tuner circuit 106 having one or more BAWRs 110, a transmitter circuit 102, an antenna 114, and a control circuit 118, coupled as shown, in accordance with some embodiments. The tuner circuit 106 may include an antenna port 112 configured to be coupled to the antenna 114, a signal port 108 configured to be coupled to an output port 104 of the transmitter circuit 102, and a control port 116 configured to be coupled to a port 120 of the control circuit 118. In some embodiments, the impedance of tuner circuit 106 may be adjusted by adjusting a BAWR or other component, described more fully below. In some embodiments, the RF communication circuit 100 may be arranged in a system-in-package (SIP) structure.

As used herein, the term "port" may represent one or more electrical, optical, or other interfaces for a number of signaling pathways. For example, the control port 116 of the tuner circuit 106 may be an interface for multiple signaling pathways between different combinations of components of the control circuit 118 and components of the tuner circuit 106. In another example, the output port 104 of the transmitter circuit 102 may be an interface for one or more active lines and one or more ground lines. Additional non-limiting examples of interfaces between the control circuit 118 and the tuner circuit 106 are discussed below. Moreover, when reference is made herein to measurement of quantities "at" or "from" a given port, any measurement made from a point electrically or otherwise equivalent to the port are considered to be measurements made "at" or "from" the port. For example, if the output port 104 of the transmitter circuit 102 provides for an active line and a ground line, to be connected respectively to active and ground lines of the signal port 108 of the tuner circuit 106, an impedance measurement of the tuner circuit 106 made "from" terminals of the output port 104 may include an impedance measurement made by accessing electrically equivalent terminals of the signal port 108.

In some embodiments, the control circuit 118 may be configured to adjust an impedance of the tuner circuit 106. The impedance of the tuner circuit 106 may be an impedance as measured from the output port 104 of the transmitter circuit 102. In some embodiments, the control circuit 118 may be configured to adjust an impedance of the tuner circuit 106 based at least in part on an impedance of the antenna 114. The control circuit 118 may measure the impedance of the antenna 114 (e.g., as measured from the antenna port 112 of the tuner circuit 106), and/or the control circuit 118 may adjust the impedance of the tuner circuit 106 based on an impedance measurement that includes both the impedance of the tuner circuit 106 and the impedance of the antenna 114 (e.g., as measured from the output port 104 of the transmitter circuit 102).

In some embodiments, the control circuit 118 may be configured to adjust an impedance of the tuner circuit 106 by adjusting a BAWR of the BAWRs 110 or another component of the tuner circuit 106. A BAWR may be generally configured to convert an electrical signal into an acoustic wave at an input electrode, and convert the acoustic wave to an electrical signal at an output electrode. In some embodiments, a BAWR may act as a frequency-dependent impedance element, exhibiting lower impedance when driven by signals at frequencies near or equal to a resonant frequency of the BAWR and exhibiting higher impedance when driven by signals at other frequencies.

Figure 2:
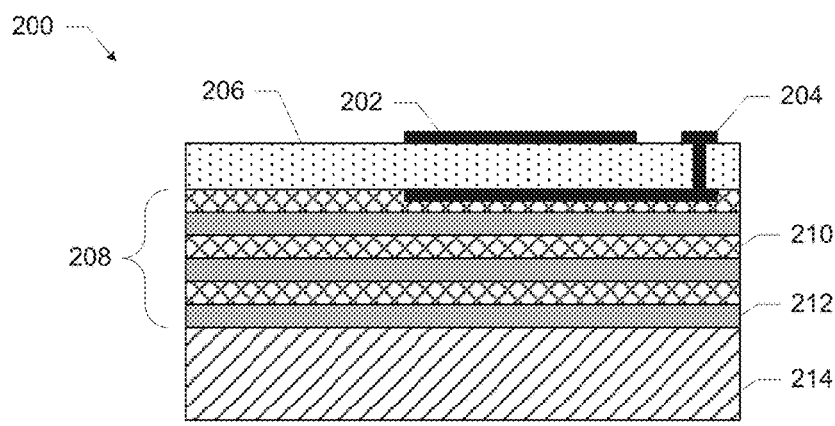
FIG. 2 is a simplified cross-sectional side view of a solidly mounted BAWR, in accordance with some embodiments.
Figure 3:
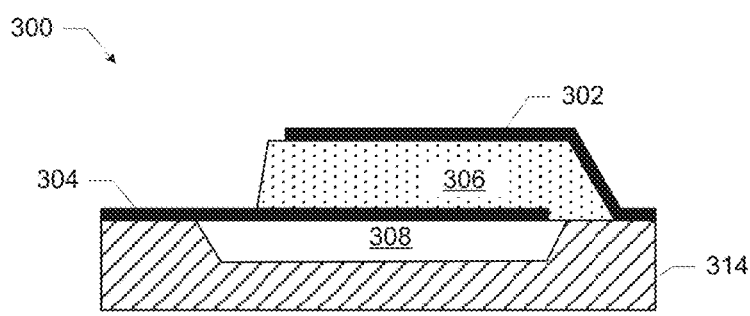
FIG. 3 is a simplified cross-sectional side view of a membrane BAWR, in accordance with some embodiments.

FIGS. 2 and 3 are simplified cross-sectional side views of two different types of BAWRs that may be included among the BAWRs 110 of the RF communication circuit 100. FIG. 2 depicts a solidly mounted BAWR 200, which may include a first electrode 202 and a second electrode 204 separated by a piezoelectric material 206 (e.g., aluminum nitride). Electrodes (such as the electrodes 202 and 204) may be formed from a conductive material, such as aluminum, molybdenum or tungsten, for example. When an alternating voltage is applied across the first electrode 202 and the second electrode 204, the first electrode 202, second electrode 204, and piezoelectric material 206 may act as a resonator, propagating an acoustic wave through the piezoelectric material and oscillating strongly at a particular resonant frequency. The first electrode 202, second electrode 204, and piezoelectric material 206 may be coupled to a reflector stack 208, which may consist of alternating layers of material having a higher acoustic impedance (e.g., the layer 210) and material having a lower acoustic impedance (e.g., the layer 212). In some embodiments, each of the layers 210 and 212 may have a thickness equal to a quarter of the wavelength associated with the resonant frequency. The reflector stack 208 may be mounted to a substrate 214. The reflector stack 208 may act as an acoustic mirror, reflecting acoustic waves back to the piezoelectric material 206 and providing acoustic isolation between the piezoelectric material 206 and the substrate 214 (limiting the coupling between the acoustic waves and the substrate 214). This isolation may improve the quality factor (Q-factor) of the BAWR 200, which may correspond to a superior ability to store energy while limiting losses.

FIG. 3 depicts a membrane BAWR 300, which may include a first electrode 302 and a second electrode 304 separated by a piezoelectric material 306. A substrate 314 (formed from, e.g., quartz, glass, alumina, sapphire or silicon, for example) may be disposed below the first electrode 302, the second electrode 304, and the piezoelectric material 306, and an air gap 308 may separate portions of the second electrode 304 and the piezoelectric material 306 from the substrate 314. The air gap 308 may provide acoustic isolation between the piezoelectric material 306 and the substrate 314, which may improve the Q-factor of the BAWR 300. As discussed above with reference to FIG. 2, when an alternating voltage is applied across the first electrode 302 and the second electrode 304, the first electrode 302, second electrode 304, and piezoelectric material 306 may act as a resonator and oscillate strongly at a particular resonant frequency.

BAWRs 110 of the tuner circuit 106 may include one or more solidly mounted BAWRs, one or more membrane BAWRs, other types of BAWRs, or a combination of multiple types of BAWRs. The selection of which types of BAWRs to include in the tuner circuit 106 may be based on, for example, performance requirements and manufacturing considerations. For example, some embodiments of solidly mounted BAWRs (such as the BAWR 200) may be more easily integrated into an IC package than some embodiments of membrane BAWRs. Some BAWRs may be purchased as prepackaged components having footprints of approximately 1 square millimeter or less. In some embodiments, a BAWR may include more than one layer of piezoelectric material, with layers separated by an electrode, and thus may include more than one "acoustic layer" through which an acoustic wave may propagate. Different electrode pairs may be differently driven (e.g., by AC or DC signals). Other acoustic resonators may be used instead of one or more of the BAWRs 110; for example, surface acoustic wave (SAW) resonators may be used.

Figure 4:
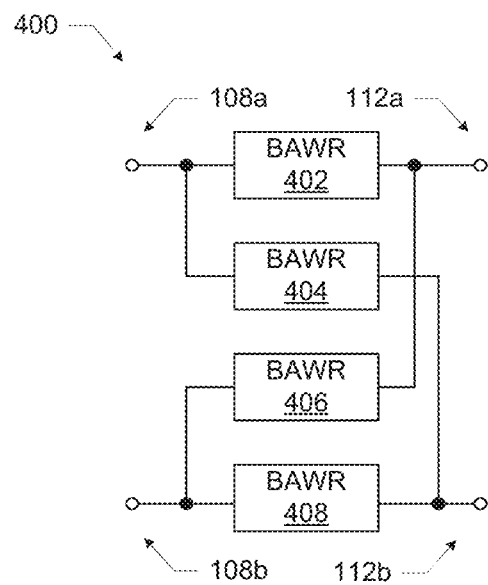
FIG. 4 illustrates a BAWR configuration that may be included in a tuner circuit, in accordance with some embodiments.
Figure 5:
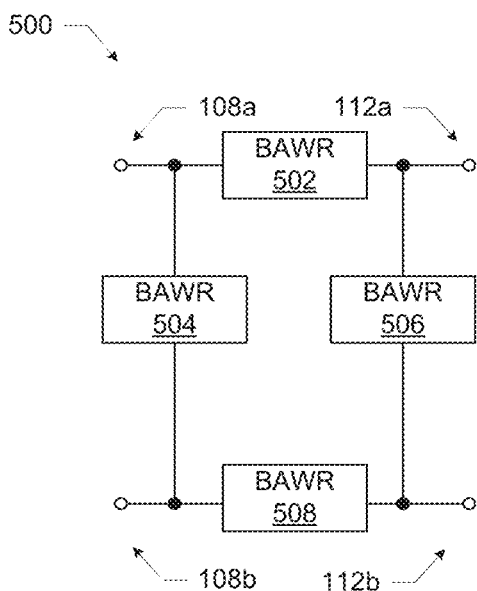
FIG. 5 illustrates a BAWR configuration that may be included in a tuner circuit, in accordance with some embodiments.

FIGS. 4 and 5 illustrate different example configurations of the BAWRs 110 that may be included in the tuner circuit 106, in accordance with some embodiments. In FIG. 4, four BAWRs 402, 404, 406 and 408 are depicted as configured as a lattice network 400 between two input terminals 108a and 108b and two output terminals 112a and 112b. In some embodiments, the input terminals 108a and 108b may be coupled to the signal port 108 of the tuner circuit 106. In some embodiments, the output terminals 112a and 112b may be coupled to the antenna port 112 of the tuner circuit 106. In FIG. 5, four BAWRs 502, 504, 506 and 508 are depicted as configured as a ladder network 500 between two input terminals 108a and 108b and two output terminals 112a and 112b. As discussed above with reference to FIG. 4, in some embodiments, the input terminals 108a and 108b may be coupled to the signal port 108 of the tuner circuit 106 and the output terminals 112a and 112b may be coupled to the antenna port 112 of the tuner circuit 106. Some embodiments of the tuner circuit 106 may include combinations of the lattice and ladder networks illustrated in FIGS. 4 and 5 (e.g., arranged in series).

As noted above, the control circuit 118 of FIG. 1 may be configured to adjust an impedance of the tuner circuit 106 by adjusting a BAWR of the BAWRs 110 or another component of the tuner circuit 106. The control circuit 118 may be configured to adjust the operation of a circuit including the BAWRs 110 in any of a number of ways. In some embodiments, the control circuit 118 may be configured to provide a DC voltage that may be applied between two electrodes of at least one BAWR included in the tuner circuit 106. For example, the control circuit 118 may include a DC voltage source having a first terminal coupled to the first electrode 202 of the solidly mounted BAWR 200 (FIG. 2), and a second terminal coupled to the second electrode 204 of the solidly mounted BAWR 200. Applying a DC voltage between two electrodes of a BAWR (e.g., BAWR 200 of FIG. 2 or BAWR 300 of FIG. 3) may cause the resonant frequency of the BAWR to shift, thereby changing the impedance of a circuit including the BAWR.

For example, in some embodiments, the piezoelectric material 206 of the BAWR 200 (or the piezoelectric material 306 of the BAWR 300) may include a ferroelectric material (such as $(Ba_xSr_{1-x})TiO_3)$ whose piezoelectric coefficient increases as a DC bias is applied. By varying the polarity of the DC potential between electrodes, resonators of varying resonance frequencies may be achieved.

In embodiments in which a BAWR includes multiple acoustic layers, different DC voltages may be applied to different layers. For example, in BAWRs with multiple piezoelectric layers, DC potentials may be varied between different pairs of electrodes to achieve different resonance behaviors. For example, a BAWR having an electrode-ferroelectric-electrode-ferroelectric-electrode structure may allow for two achievable resonance modes that the control circuit 118 may switch between.

In some embodiments, the control circuit 118 may provide the same or different DC voltage configurations to different ones of multiple BAWRs included in the tuner circuit 106 (in addition to varying the DC voltages across one or more piezoelectric layer of a single BAWR). In some embodiments, the control circuit 118 may be configured to adjust the DC voltage(s) applied to one or more of the BAWRs 110 in order to achieve a desired impedance of the tuner circuit 106. In some embodiments, one or more processors or other logic devices may determine the desired impedance for the tuner circuit based in part on a desired frequency or band of frequencies of operation for the RF communication circuit 100 (e.g., during transmission or reception of RF signals) and the known characteristics of the components of the RF communication circuit 100 (e.g., the impedance of the transmitter circuit 102 at various frequencies). These one or more processors or logic devices may be included in the control circuit 118 or may be separate from the control circuit 118.

In some embodiments, the control circuit 118 may be configured to adjust a BAWR of the BAWRs 110 or another component of the tuner circuit 106 by providing one or more control signals to various components in the tuner circuit 106. For example, the control circuit 118 may include an adjustable DC voltage or other signal source for applying an adjustable DC voltage or other signal to one or more of variable capacitors arranged in series or in parallel with at least one of the BAWRs 110. Adding a capacitor in series with a BAWR may increase the capacitance of the total circuit, while adding a capacitor in parallel with a BAWR may decrease the capacitance of the total circuit. Thus, by including variable capacitors in series and/or parallel combinations with arrangements of the BAWRs 110, a range of resulting capacitive behavior may be achieved. The control signals applied to the variable capacitors may cause the variable capacitors to vary their capacitances, thereby adjusting the impedance of the tuner circuit 106 as would be measured from the output port 104 of the transmitter circuit 102.

Figure 6:
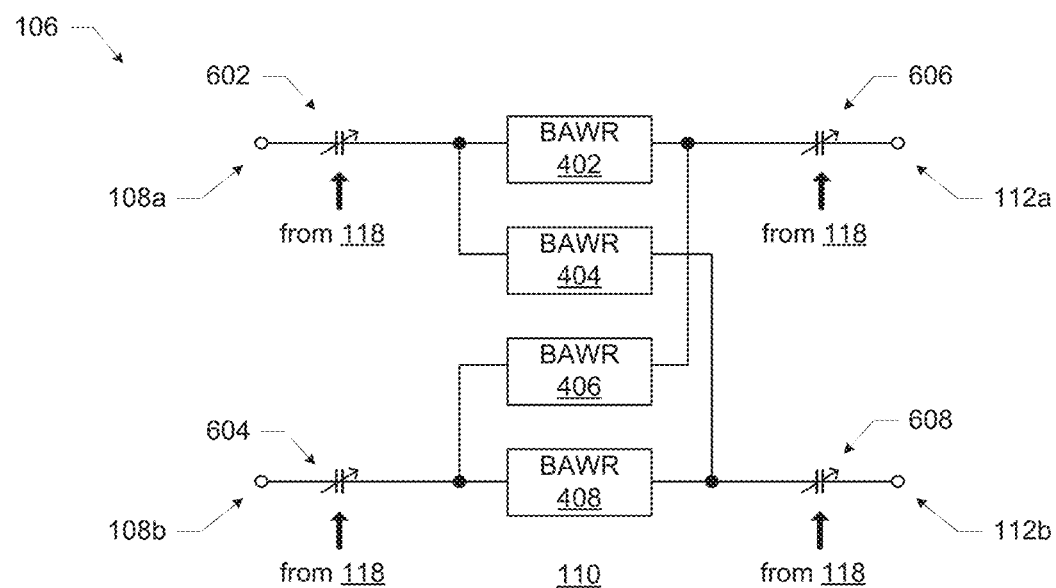
FIG. 6 illustrates an example of a tuner circuit having BAWRs and variable capacitors, in accordance with some embodiments.

FIG. 6 illustrates an example of a tuner circuit 106 having BAWRs 402, 404, 406 and 408 of the lattice network 400 of FIG. 4 arranged with variable capacitors 602, 604, 606 and 608. The variable capacitors may be controlled via a DC or other control signal from the control circuit 118 via the control port 116 of the tuner circuit 106. The input terminals 108a and 108b may be coupled to the signal port 108 of the tuner circuit 106 and the output terminals 112a and 112b may be coupled to the antenna port 112 of the tuner circuit 106.

In some embodiments, a variable capacitor (e.g., one or more of the variable capacitors 602, 604, 606 and 608 of FIG. 6) may be a complementary metal oxide semiconductor (CMOS) varactors whose capacitance is adjusted by a DC bias. In embodiments including one or more varactors, a varactor stack may be packaged on top of or in proximity to the BAWRs 110, which may minimize the length of connective wiring between the varactors and the BAWRs 110 and thereby reduce losses. In some embodiments, a variable capacitor (e.g., one or more of the variable capacitors 602, 604, 606 and 608 of FIG. 6) may be a microelectromechanical systems (MEMS) capacitor whose capacitance may be adjusted by signals generated by one or more processing devices or other logic included in the control circuit 118. In some embodiments, a MEMS capacitor may be included in a prepackaged, commercially available MEMS capacitive array module along with an RF switch, and may be tuned using digital signals supplied by the control circuit 118 to the module. In various embodiments, a variable capacitor or other component may be packaged with components of the control circuit 118, packaged with components of the tuner circuit 106, distributed between the different packages including the control circuit 118 and the tuner circuit 106, or included in a single package that includes both the control circuit 118 and the tuner circuit 106, for example.

Figure 7:
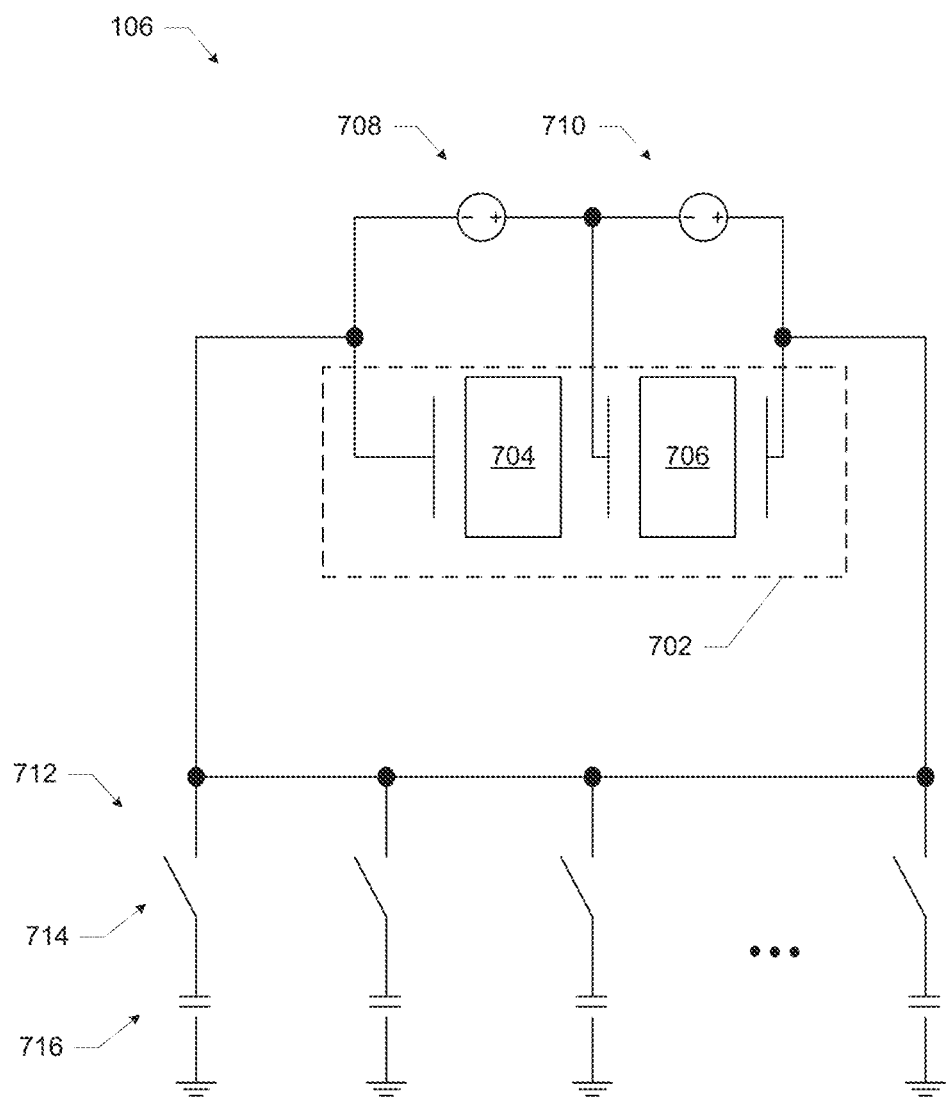
FIG. 7 illustrates an example of a tuner circuit having a BAWR and capacitors with switches, in accordance with some embodiments.

FIG. 7 illustrates an example of a tuner circuit 106 having a BAWR 702 with two piezoelectric layers 704 and 706 whose DC bias may be adjusted by DC voltage sources 708 and 710, respectively. The tuner circuit 106 may also include a number of switch-capacitor branches 712 (e.g., one or more switch-capacitor branches 712). Each switch-capacitor branch 712 may include an RF switch 714 and a capacitor 716. The RF switches may be controllable by the control circuit 118 using DC voltages in order to modify the effective capacitance of the tuner circuit 106, and the resonant frequency of the BAWR 702 may be modified by adjusting the values provided by the DC voltage sources 708 and 710 (which may be part of or controlled by the control circuit 118).

In some embodiments, the capacitor 716 may be a metal-insulator-metal (MIM, also called a metal-oxide-metal) capacitor. A MIM capacitor may include a thin dielectric layer between bottom and top metal plates, and may have the bottom and top metal plates connected to other circuitry by vias running through insulating material (e.g., as formed by a CMOS process). Multiple metal layers and lateral flux may be used to realize high capacitance values, with some MIM capacitors having a Q-factor as high as 80. When MIM or other capacitors are combined with a tunable BAWR configuration as shown in FIG. 7, a good tuning range and low overall insertion loss may be achieved for the tuner circuit 106. In some embodiments, the BAWR 702 of FIG. 7 may be replaced with a different acoustic resonator, such as a SAW resonator.

Various embodiments of the BAWR-based tuner circuits disclosed herein (e.g., the tuner circuit 106) may provide improved performance over conventional RF tuner circuits. In some embodiments, a BAWR-based tuner circuit may have a higher Q-factor than conventional inductor-capacitor resonator-based tuner circuits. In some embodiments, the insertion loss of a BAWR-based tuner circuit, which represents the ratio of power input to and output from a component, may be lower than achievable with conventional tuners. Additionally, by configuring the control circuit 118 to adjust the BAWR-based tuner circuit 106, deviations in performance between different BAWRs (and between a single BAWR and its nominal specifications) can be compensated for during operation. The use of BAWRs in RF communication devices has traditionally been limited to filtering applications; the techniques and configurations disclosed herein utilize BAWRs in entirely different contexts and for different purposes, capitalizing on the benefits achievable by advantageous arrangements of BAWRs with other circuitry.

Various embodiments of the RF communication circuit 100 of FIG. 1 may be utilized in mobile communication devices in various ways. In some embodiments, the RF communication circuit 100 may be included in a mobile communication device in order to perform impedance matching between the transmitter circuit 102 and a combination of the tuner circuit 106 and the antenna 114. Some such embodiments may also be configured to perform impedance matching between a receiver and a combination of the tuner circuit 106 and the antenna 114. Configuring the RF communication circuit 100 for matching the impedance of a transmitter and/or a receiver over multiple frequency bands of operation (e.g., in the range of 950 MHz-270 GHz) may allow a mobile communication device to achieve maximal or nearly maximal RF power transfer between the receiver/transmitter and the antenna, improving performance.

In some embodiments, the transmitter circuit 102 and the antenna 114 may be "matched" when the tuner circuit 106 provides a 11% or better improvement in the power transfer efficiency of the RF communication circuit 100 (e.g., 1 dB or greater improvement in the total radiated power from the antenna 114). In some embodiments, greater improvements in power transfer efficiency may be achieved when components are "matched." The amount of improvement achievable may depend on the impedance discrepancy between the antenna 114 and the transmitter circuit 102 without the use of the tuner circuit 106. For example, when the voltage standing wave ratio (VSWR) between the antenna 114 and the transmitter circuit 102 is large (e.g., 9 or more), the tuner circuit 106 may allow the RF communication circuit 100 to achieve 2 dB or more of improvement; when the VSWR between the antenna 114 and the transmitter circuit 102 is smaller (e.g., 3 or less), the percentage improvement may be smaller (e.g., less than 1 dB).

Figure 8:
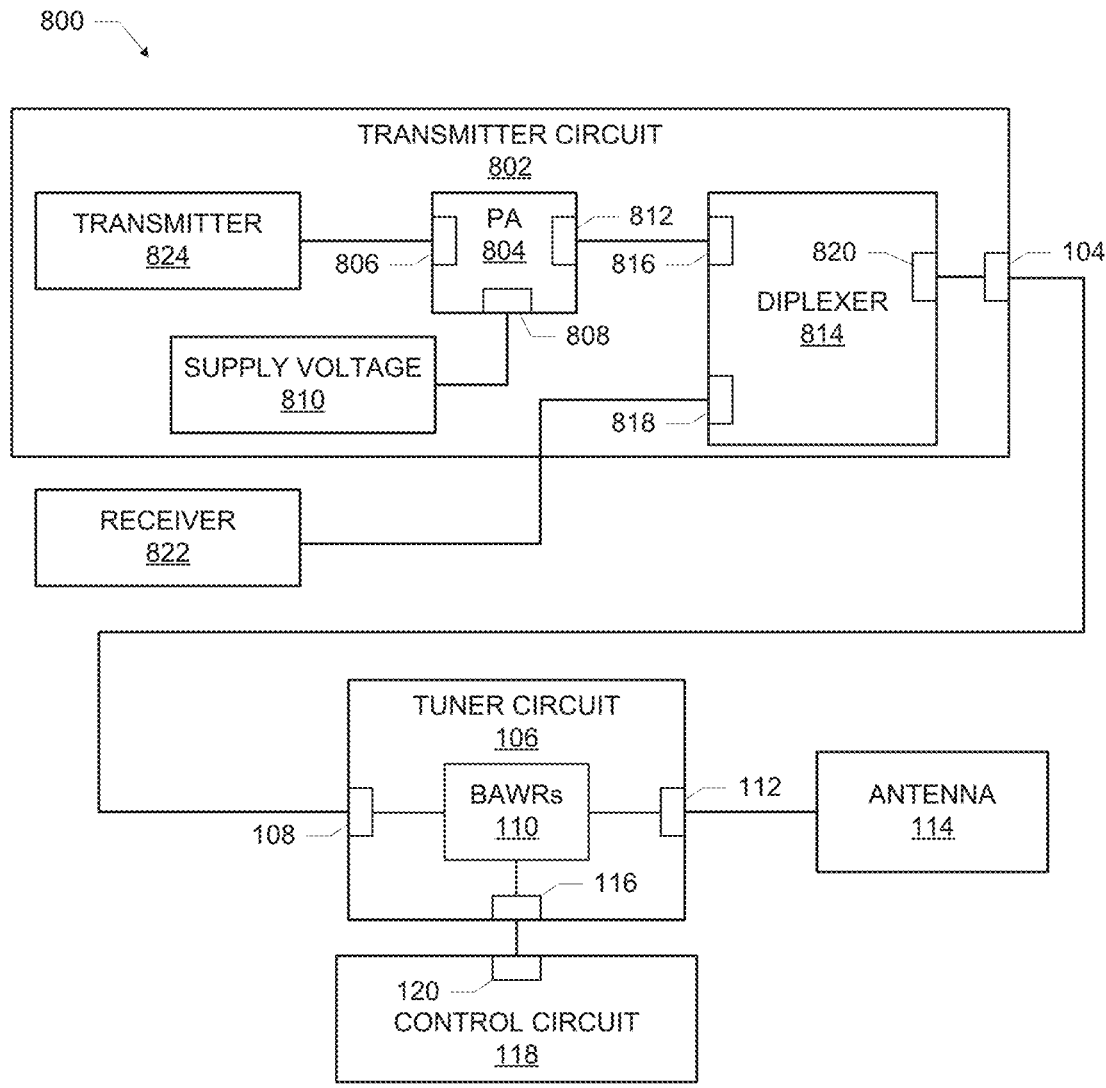
FIG. 8 schematically illustrates an embodiment of the RF communication circuit of FIG. 1 configured for impedance matching, in accordance with some embodiments.

FIG. 8 schematically illustrates an embodiment 800 of the RF communication circuit 100 of FIG. 1, the RF communication circuit 800 configured for impedance matching. As discussed above with reference to FIG. 1, the RF communication circuit 800 may include a tuner circuit 106 having one or more BAWRs 110, a transmitter circuit 802, an antenna 114, and a control circuit 118. The tuner circuit 106 may include an antenna port 112 coupled to the antenna 114, a signal port 108 coupled to an output port 104 of the transmitter circuit 802, and a control port 116 coupled to a port 120 of the control circuit 118. The RF communication circuit 800 may further include a receiver 822. In some embodiments, the RF communication circuit 800 may be arranged in an SIP structure.

As shown in FIG. 8, the transmitter circuit 802 may include a diplexer 814 having a transmitter port 816 coupled to a transmitter 824 (as shown, via a power amplifier (PA) 804), a receiver port 818 coupled to the receiver 822, and a diplexer output port 820 coupled to the output port 104 of the transmitter circuit 802. The diplexer 814 may be configured to controllably couple the diplexer output port 820 to one of the transmitter port 816 and the receiver port 818 in response to a control signal (not shown). In some embodiments, the control circuit 118 may be configured to adjust the impedance of the tuner circuit 106 so that a combined impedance of the tuner circuit 106 and the antenna 114, as measured at the output port 104 of the transmitter circuit 802, is matched to an impedance of the transmitter 824 when the diplexer output port 820 is coupled to the transmitter port 816. In some embodiments, the control circuit 118 may be configured to adjust the impedance of the tuner circuit 106 so that a combined impedance of the tuner circuit 106 and the antenna 114, as measured at the output port 104 of the transmitter circuit 802, is matched to an impedance of the receiver 822 when the diplexer output port 820 is coupled to the receiver port 818.

The control circuit 118 may be configured to adjust the impedance of the tuner circuit 106 in any suitable manner to perform impedance matching, including using any of the impedance adjustment techniques discussed above. For example, in some embodiments, the control circuit 118 may be configured to provide a DC voltage to be applied between two electrodes of at least one BAWR of the BAWRs 110, included in the tuner circuit 106, to adjust the impedance of the tuner circuit 106. In some embodiments, the control circuit may include an adjustable DC voltage source for applying an adjustable DC voltage to adjust the capacitance of a varactor arranged in series or in parallel with at least one of the one or more BAWRs 110. In some embodiments, the control circuit may include a signal source for applying electrical signals to adjust the capacitance of a MEMS capacitor arranged in series or in parallel with at least one of the one or more BAWRs 110.

As shown in FIG. 8, the transmitter circuit 802 may include the PA 804, which may amplify the signal from the transmitter 824 for transmission to the antenna 114. The PA 804 may include a PA input port 806 coupled to the transmitter 824, a PA output port 812 coupled to the transmitter port 816 of the diplexer 814, and a supply voltage port 808 coupled to a supply voltage source 810. In some embodiments, the PA 804 may be packaged as a single IC package.

Various embodiments of the BAWR-based RF communication circuit 100 (e.g., the RF communication circuit 800) may provide improved performance over conventional impedance matching circuitry. For example, the RF communication circuit 800 may achieve better impedance matching than conventional circuits, reducing the amount of spurious radiation emitted by the antenna 114 and making it easier for a mobile communication device to comply with specific absorption rates and other requirements of different wireless communication standards. Additionally, due to the high Q-factor and low insertion loss of the tuner circuit 106 (e.g., less than 0.6 dB of insertion loss), some embodiments of the RF communication circuit 800 may extend the life of batteries or other energy sources powering a mobile communication device by limiting power losses, even at high transmit power levels. Further, the impedance matching embodiments of the RF communication circuit 100 may reduce costs by eliminating the need for a discrete tuner component, and may save area on a printed circuit board included in a mobile communication device or other computing device (thereby potentially reducing the size of the device and achieving other benefits of smaller footprint devices).

In some embodiments, the RF communication circuit 100 may be included in a mobile communication device in order to perform load line switching for a PA. A PA typically receives a supply voltage and provides current to a load at a specified output power level. For a given supply voltage and load, most PAs have a peak output power, and operate most efficiently when the specified output power level is equal or close to the peak output power. When a specified output power level is desired, the PA's peak output power may be adjusted by adjusting the supply voltage and/or the load. When the RF communication circuit 100 is configured for load-line switching, the circuit may adjust the load seen by a PA in accordance with a specified output power level to improve efficiency. Load line switching may be particularly useful in mobile communication device applications in which a wireless standard (e.g., Universal Terrestrial Radio Access Network (UTRAN), Code Division Multiple Access (CDMA, e.g., CDMA-2000) or Global System for Mobile Communication (GSM)) includes a power control scheme that ensures that a mobile communication device transmits only with the amount of power needed to achieve satisfactory communication performance with a base station (in order to reduce the PA current and conserve battery life to extend communication time). Load line switching may also compensate for differences between the range of optimal output impedances for a PA (e.g., 2-10 ohms) and the impedance of a typical antenna (e.g., 50 ohms).

Figure 9:
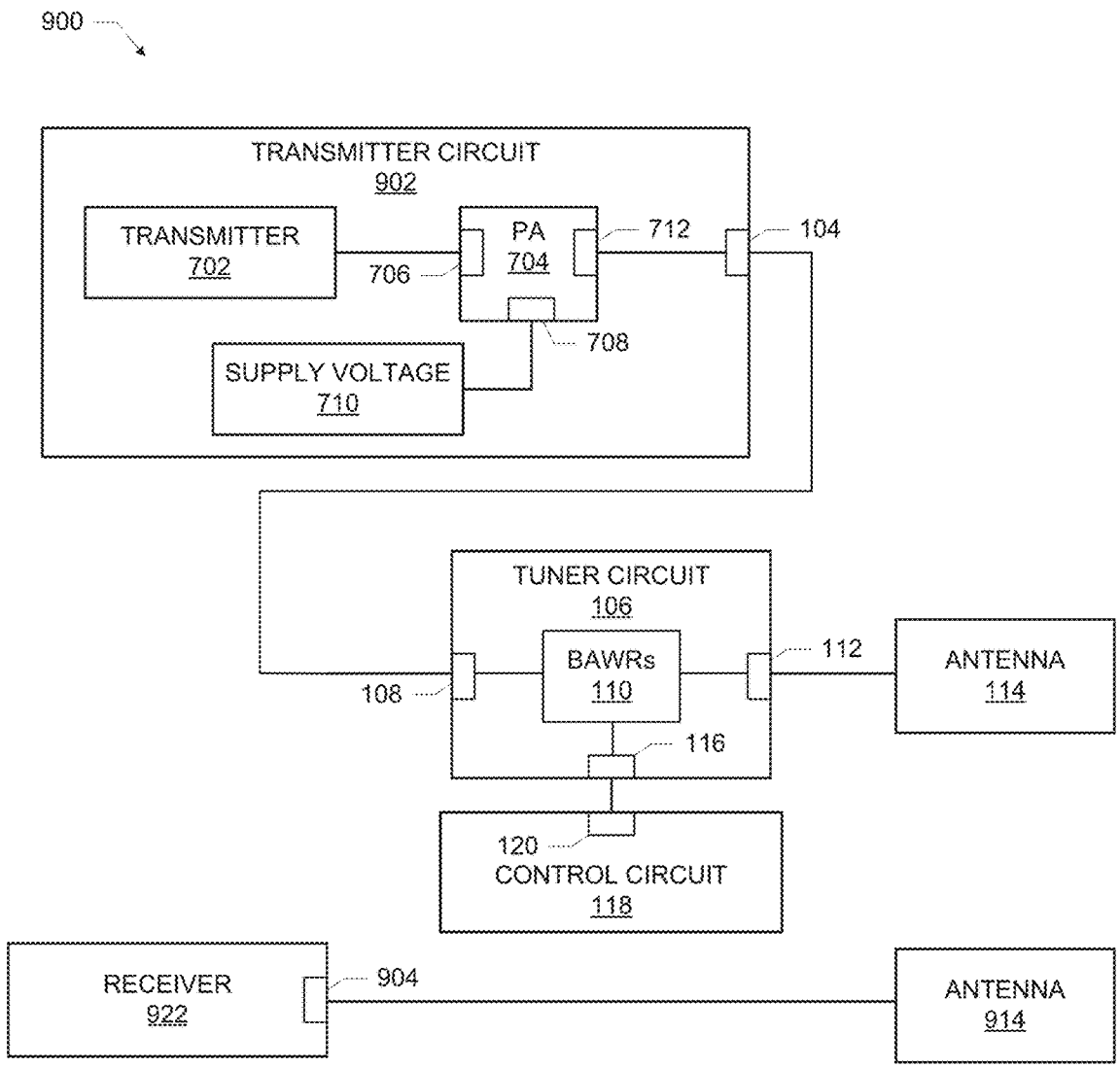
FIG. 9 schematically illustrates an embodiment of the RF communication circuit of FIG. 1 configured for load line switching, in accordance with some embodiments.

FIG. 9 schematically illustrates an embodiment 900 of the RF communication circuit 100 of FIG. 1 configured for load line switching. As discussed above with reference to FIG. 1, the RF communication circuit 900 may include a tuner circuit 106 having one or more BAWRs 110, a transmitter circuit 902, an antenna 114, and a control circuit 118. The tuner circuit 106 may include an antenna port 112 coupled to the antenna 114, a signal port 108 coupled to an output port 104 of the transmitter circuit 902, and a control port 116 coupled to a port 120 of the control circuit 118. In some embodiments, the RF communication circuit 900 may be arranged in an SIP structure.

The RF communication circuit 900 may further include a receiver 922 having an antenna port 904 coupled to a second antenna 914. The receiver 922 may include a low-noise amplifier and other components. A dual-antenna architecture, as shown in FIG. 9, may eliminate the need for a diplexer or duplexing filter to switch between and/or isolate transmission and reception. Additionally, a dual-antenna architecture may allow improved matching of components (e.g., the transmitter circuit 102 to the tuner circuit 106 and antenna 114, and the receiver 922 to the antenna 914).

As shown in FIG. 9, the transmitter circuit 902 may include a PA 804. The PA 804 may include a supply voltage port 808 for receiving a supply voltage from a supply voltage source 810, and a PA output port 812 coupled to the output port 104 of transmitter circuit 902. The PA 804 may be configured to output (via the PA output port 812) a current at an output power level that is specified by one or more processors or other logic devices (not shown).

The PA 804 may have a peak output power, which may be based at least in part on an impedance of the tuner circuit 106 and the antenna 114, as measured at the output port 104 of the transmitter circuit 902. In some embodiments, the control circuit 118 may be configured to adjust the impedance of the tuner circuit 106 to match the peak output power of the PA 804 to the output power level. In some embodiments, the control circuit 118 may be configured (e.g., with one or more processors or other logic devices) to adjust the impedance of the tuner circuit 106 to match the peak output power of the PA 804 to the output power level based at least in part on a distance between the mobile communication device and a base station in communication with the mobile communication device. In some embodiments, the supply voltage provided to the PA 804 by the supply voltage source 810 may be fixed; in some embodiments, (e.g., when the IC package is included in a mobile communication device), the supply voltage provided to the PA 804 may be adjusted by a controller (not shown) based at least in part on a distance between the mobile communication device and a base station in communication with the mobile communication device.

As noted above, compared to the transmitter circuit 802 of FIG. 8, no diplexer is included in the transmitter circuit 902 of FIG. 9 because the receiver 922 and the transmitter circuit 902 each have their own designated antenna (antennas 124 and 914, respectively). In particular, no diplexer is interposed between the PA 804 and the tuner circuit 106 in the RF communication circuit 900 of FIG. 9.

The control circuit 118 may be configured to adjust the impedance of the tuner circuit 106 in any suitable manner to perform load line switching, including using any of the impedance adjustment techniques discussed above. For example, in some embodiments, the control circuit 118 may be configured to provide a DC voltage to be applied between two electrodes of at least one BAWR of the BAWRs 110, included in the tuner circuit 106, to adjust the impedance of the tuner circuit 106. In some embodiments, the control circuit may include an adjustable DC voltage source for applying an adjustable DC voltage to adjust the capacitance of a varactor arranged in series or in parallel with at least one of the one or more BAWRs 110. In some embodiments, the control circuit may include a signal source for applying electrical signals to adjust the capacitance of a MEMS capacitor arranged in series or in parallel with at least one of the one or more BAWRs 110. Any suitable switching network and configuration of BAWRs 110 and other components may be used to adjust the impedance of the tuner circuit 106 (e.g., as a function of the output power level) and perform load line switching.

Various embodiments of the BAWR-based RF communication circuit 100 (e.g., the circuit 900) may provide improved performance over DC-DC converter technology for adjusting the peak output power of a PA and over conventional load line switching circuitry. As discussed above, DC-DC converters may be expensive and highly noisy, degrading RF communication performance. Existing load line switching circuitry (e.g., load line switching networks) may be highly lossy. The BAWR-based RF communication circuit 800 may provide load line switching with reduced losses, and may be integrated into an IC package, thereby saving area on a printed circuit board in comparison to conventional approaches (which may require, e.g., off-chip components).

Figure 10:
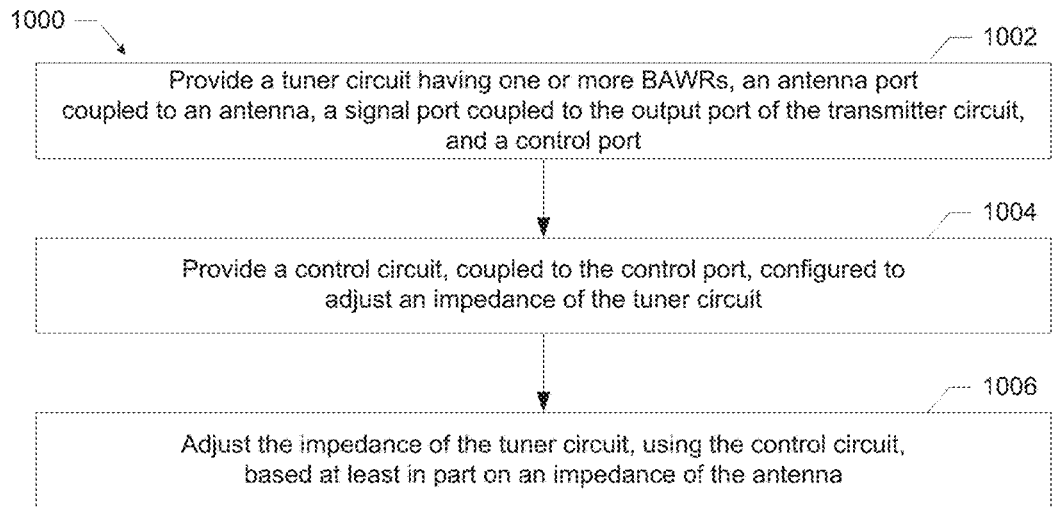
FIG. 10 is a flow diagram of a method of RF communication, in accordance with some embodiments.

FIG. 10 is a flow diagram 1000 of a method of RF communication, in accordance with some embodiments. The method of the flow diagram 1000 may comport with actions described in connection with FIGS. 1-8, in some embodiments. Various operations are described as multiple discrete operations in turn for illustrative purposes; the order of description should not be construed as to imply that these operations are necessarily order-dependent.

At 1002, a tuner circuit may be provided. The tuner circuit may have one or more BAWRs, an antenna port coupled to an antenna, a signal port coupled to the output port of the transmitter circuit, and a control port. In some embodiments, the tuner circuit of 1002 may be configured as discussed with reference to any of FIGS. 1-6. In some embodiments, the transmitter circuit of 1002 may be configured as discussed with reference to any of FIGS. 1 and 8-8.

At 1004, a control circuit may be provided. The control circuit may be coupled to the control port, and may be configured to adjust an impedance of the tuner circuit. In some embodiments, the control circuit of 1004 may be configured as discussed above with reference to any of FIGS. 1-8.

At 1006, the impedance of the tuner circuit may be adjusted, using the control circuit, based at least in part on an impedance of the antenna. In some embodiments, the impedance adjustment of 1006 may be performed using any of the techniques described above with reference to FIGS. 1-8.

For example, in some embodiments of the method of the flow diagram 1000, the transmitter circuit may include a PA having a supply voltage port for receiving a supply voltage and a PA output port coupled to the output port of the transmitter circuit (e.g., as shown in FIG. 9). The PA output port may be configured for outputting a current at an output power level, and the PA has a peak output power based at least in part on an impedance of the tuner circuit and the antenna, as measured at the output port. In some such embodiments, adjusting the impedance of the tuner circuit at 1006, using the control circuit 118, may include adjusting an impedance of the tuner circuit to match the peak output power of the PA to the output power level.

In some embodiments of the method of the flow diagram 1000, the transmitter circuit may include a diplexer having a transmitter port coupled to a transmitter, a receiver port coupled to a receiver, and a diplexer output port coupled to the output port of the transmitter circuit (e.g., as shown in FIG. 8). The diplexer output port may be controllably coupled to one of the transmitter port and the receiver port. In some such embodiments, adjusting the impedance of the tuner circuit at 1002, using the control circuit, may include adjusting the impedance of the tuner circuit so that a combined impedance of the tuner circuit and the antenna, as measured at the output port of the transmitter circuit, is matched to an impedance of the transmitter when the diplexer output port is coupled to the transmitter port.

Various embodiments of the RF communication circuit 100 of FIG. 1 (including, e.g., the embodiments discussed with reference to FIGS. 8 and 9) may be integrated into an IC package (e.g., an SIP) in a number of ways. FIGS. 11-15 provide views of various IC package embodiments of the RF communication circuit 100 of FIG. 1. The embodiments shown in FIGS. 11-15 are merely illustrative, and any suitable combination of elements of these embodiments may be used.

The choice of packaging arrangement may be based on, for example, minimizing costs, the number of layers in the package, meeting dimension specifications, and/or reducing wiring lengths, among others. In some embodiments, the RF communication circuit 100 may be packaged using a fan-out wafer level structure. In some embodiments, manufacturing such a package may include constructing an artificial wafer out of placed dies. These dies may be tested prior to generation of the artificial wafer, and may include active and/or passive components and one or more different types of dies. The artificial wafer may be constructed by printing, molding, laminating, pressing or other similar techniques. In some embodiments, the artificial wafer may be constructed using molding to form an embedded ball grid array (BGA) structure. In some embodiments, the embedded ball grid array structure may be a fan-out wafer level ball grid array structure (fan-out WLB) structure. For example, the embedded ball grid array structure may be an embedded wafer level ball grid array (eWLB) structure. Any suitable dies, components or packages, package technologies, or package concepts may be embedded or stacked in a fan-out WLB structure to package any of the embodiments disclosed herein, including open cavity packages, SIPs, wafer level ball grid array (WLB) packages, eWLB packages, flip chip packages, wire-bonded packages, or any combination of such packages.

Figure 11:
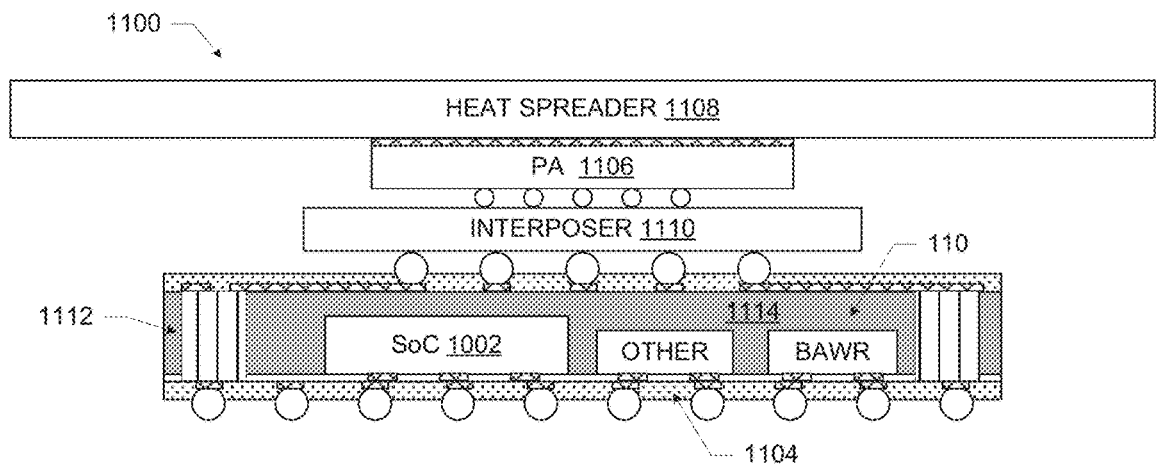
FIG. 11 is a simplified cross-sectional side view of a first integrated circuit (IC) package embodiment of the RF communication circuit of FIG. 1, in accordance with some embodiments.
Figure 12:
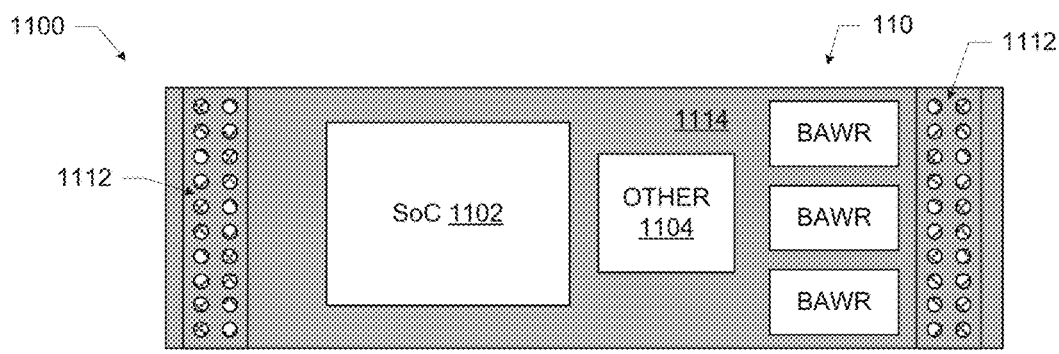
FIG. 12 is a simplified top view of the IC package of FIG. 11, in accordance with some embodiments.

FIGS. 11 and 12 are simplified cross-sectional side and top views, respectively, of a first IC package embodiment 1100 of the RF communication circuit 100, in accordance with some embodiments. The IC package 1100 may include a fan-out BGA structure and/or an embedded BGA structure (e.g., an eWLB structure) wherein a mold compound 1114 is used to embed a system-on-a-chip (SoC) 1102, one or more BAWRs 110, and one or more dies 1104 including other circuitry (e.g., one or more inductors). In some embodiments, the SoC 1102 may include some or all of the transmitter circuit 102 and the control circuit 118. In some embodiments (e.g., the RF communication circuits 800 and 900 of FIGS. 8 and 9, respectively), the SoC 1102 may include some or all of a receiver (e.g., the receiver 822 or 902 of FIGS. 8 and 9, respectively). In some embodiments, the one or more dies 1104 may include a diplexer, such as the diplexer 814 of FIG. 8. As shown in FIG. 12, the IC package 1100 may include multiple BAWRs 110; although three are depicted, any suitable number may be included.

In some embodiments, one or more of the BAWRs 110 may require a lid structure for mechanical protection of an active area on a surface of a BAWR die. In some such embodiments, electrical connections to a BAWR die may be made by copper post structures or solder balls on the BAWR die (e.g., at the corners of the die to protect active areas between two or more of the posts). Copper post structures and other connectors may be connected within the IC package 1100 during the redistribution phase of eWLB manufacturing.

The IC package 1100 may also include a PA 1106, which may serve as the PA 804 in embodiments in accordance with the RF communication circuits discussed above with reference to FIGS. 8 and 9. In some embodiments, the PA 1106 may be a previously packaged component, and thus may be integrated with the rest of the IC package 1100 in a package-on-package structure. In some embodiments, the PA 1106 may be disposed outside the mold compound 1114. As shown in FIG. 11, the PA 1106 may be mounted to an interposer 1110, which may provide mechanical support to the PA 1106 and which may route electrical connections between the PA 1106 and other circuitry in the IC package 1100. The interposer 1110 may be a silicon flip-chip structure. A heat spreader 1108 may be mounted to the PA 1106 to dissipate heat generated by the PA 1106. In some embodiments, a heat spreader may be mounted to an IC package using a thermally conductive paste. The heat spreader 1108 may be a stand-alone heat sink, or may be connected to an outer shell of a computing device in which the IC package 1100 is included (e.g., a mobile communication device) or a larger heat sink. A number of through-mold vias 1112 may be routed through the mold compound 1114 to provide electrical connections between different components of the IC package 1100 and/or between the IC package 1100 and other devices. Through-mold vias may be formed by positioning prefabricated bars made of silicon or other material, and/or by drilling holes into a mold compound (e.g., the mold compound 1114) and filling the holes with conductive material.

Figure 13:
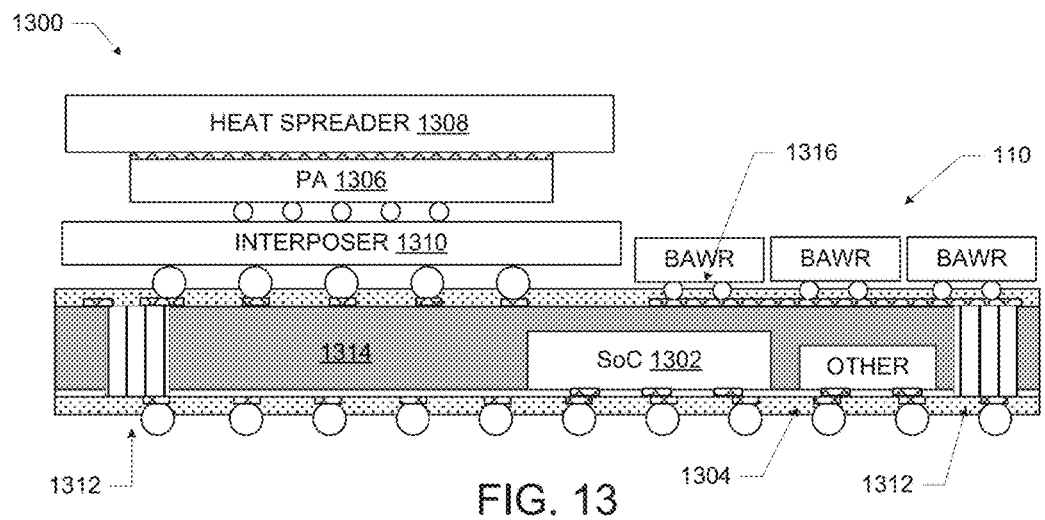
FIG. 13 is a simplified cross-sectional side view of a second IC package embodiment of the RF communication circuit of FIG. 1, in accordance with some embodiments.

FIG. 13 is a simplified cross-sectional side view of a second IC package embodiment 1300 of the RF communication circuit 100, in accordance with some embodiments. The IC package 1300 may include a fan-out BGA structure and/or an embedded BGA structure (e.g., an eWLB structure) wherein a mold compound 1314 is used to embed a system-on-a-chip (SoC) 1302 and one or more dies 1304 including other circuitry (e.g., one or more inductors). In some embodiments, the SoC 1302 may include some or all of the transmitter circuit 102 and the control circuit 118. In some embodiments (e.g., the RF communication circuits 800 and 900 of FIGS. 8 and 9, respectively), the SoC 1302 may include some or all of a receiver (e.g., the receiver 822 or 922 of FIGS. 8 and 9, respectively). In some embodiments, the one or more dies 1304 may include a diplexer, such as the diplexer 814 of FIG. 8.

In the IC package 1300, one or more of the BAWRs 110 may be disposed outside the mold compound 1314. Although three BAWRs 110 are depicted in FIG. 13, any suitable number may be included. In particular, the BAWRs 110 shown in FIG. 13 are attached to a top side of a fan-out wafer level package. The IC package 1300 may also include a PA 1306, disposed outside the mold compound 1314 and side-by-side with the BAWRs 110. The PA 1306 may serve as PA 804 in embodiments in accordance with the RF communication circuits discussed above with reference to FIGS. 8 and 9. As discussed above with reference to FIG. 11, the PA 1306 may be mounted to an interposer 1310, and a heat spreader 1308 may be mounted to the PA 1306. The interposer 1310 may be a silicon flip-chip structure. The heat spreader 1308 may be a stand-alone heat sink, or may be connected to an outer shell of a computing device in which the IC package 1300 is included (e.g., a mobile communication device) or a larger heat sink. A number of through-mold vias 1312 may be routed through the mold compound 1314 to provide electrical connections between different components of the IC package 1300 and/or between the IC package 1300 and other devices. An IC package arrangement like the IC package 1300 may be advantageous when the embedding of the BAWRs 110 in a mold compound has a negative impact on the performance of the BAWRs 110 and/or the embedding of the BAWRs 110 is prohibitively difficult or expensive. In particular, various IC packages of the RF communication circuit 100 may mount the BAWRs 110 in order to maintain a gap 1316 between the active area of a BAWR and a proximal surface to protect the active area. Maintaining such a gap in an IC package may improve performance of a BAWR.

Figure 14:
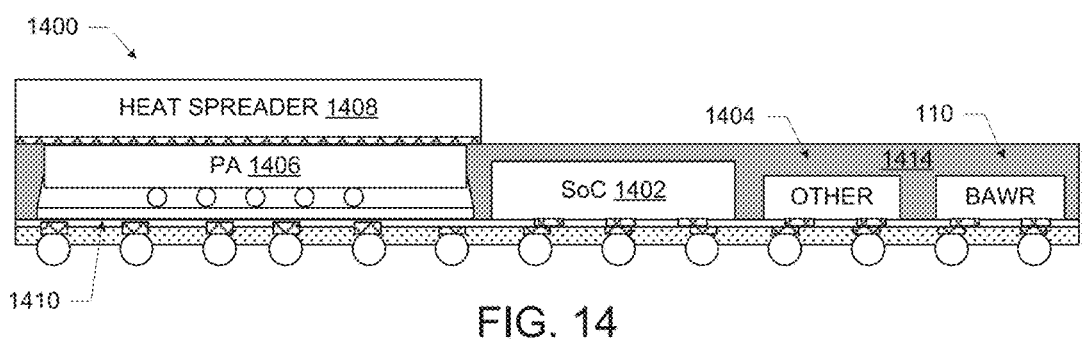
FIG. 14 is a simplified cross-sectional side view of a third IC package embodiment of the RF communication circuit of FIG. 1, in accordance with some embodiments.

FIG. 14 is a simplified cross-sectional side view of a third IC package embodiment 1400 of the RF communication circuit 100, in accordance with some embodiments. The IC package 1400 may include a fan-out BGA structure and/or an embedded BGA structure (e.g., an eWLB structure) wherein a mold compound 1414 is used to embed a system-on-a-chip (SoC) 1402, one or more BAWRs 110, and one or more dies 1404 including other circuitry (e.g., one or more inductors). As discussed above, in some embodiments, the SoC 1402 may include some or all of the transmitter circuit 102 and the control circuit 118. In some embodiments (e.g., the RF communication circuits 800 and 900 of FIGS. 8 and 9, respectively), the SoC 1402 may include some or all of a receiver (e.g., the receiver 822 or 922 of FIGS. 8 and 9, respectively). In some embodiments, the one or more dies 1404 may include a diplexer, such as the diplexer 814 of FIG. 8.

The IC package 1400 may also include a PA 1406 embedded in the mold compound 1414. As discussed above, the PA 1406 may serve as the PA 804 in embodiments in accordance with the RF communication circuits discussed above with reference to FIGS. 8 and 9. The PA 1406 may be mounted to an interposer 1410, and a heat spreader 1408 may be mounted to the PA 1406. The interposer 1410 may be a silicon flip-chip structure. The heat spreader 1408 may be a stand-alone heat sink, or may be connected to an outer shell of a computing device in which the IC package 1400 is included (e.g., a mobile communication device) or a larger heat sink. No through-mold vias are depicted in FIG. 14; ball connectors are provided for connecting the components of the IC package 1400 to other devices. The manufacture of the IC package 1400 may be simplified by the elimination of through-mold vias (e.g., as compared to the IC package 1300 of FIG. 13). The potentially larger lateral dimension of the IC package 1400 (e.g., as compared to the IC package 1300 of FIG. 13) may be suitable and not disadvantageous for certain applications (e.g., when the IC package 1400 is included in a tablet computing device or larger mobile communication device).

Figure 15:
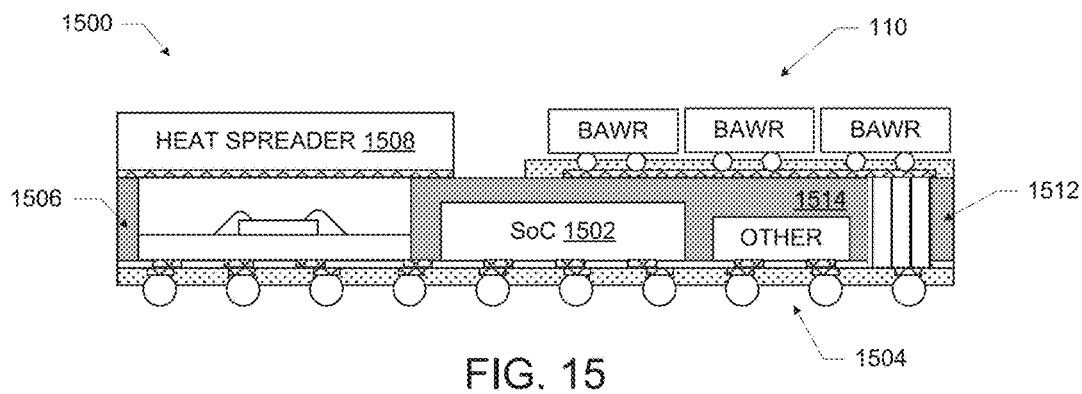
FIG. 15 is a simplified cross-sectional side view of a fourth IC package embodiment of the RF communication circuit of FIG. 1, in accordance with some embodiments.

FIG. 15 is a simplified cross-sectional side view of a fourth IC package embodiment 1500 of the RF communication circuit 100, in accordance with some embodiments. The IC package 1500 may include a fan-out BGA structure and/or an embedded BGA structure (e.g., an eWLB structure) wherein a mold compound 1514 is used to embed a system-on-a-chip (SoC) 1502 and one or more dies 1504 including other circuitry (e.g., one or more inductors). As discussed above, in some embodiments, the SoC 1502 may include some or all of the transmitter circuit 102 and the control circuit 118. In some embodiments (e.g., the RF communication circuits 800 and 900 of FIGS. 8 and 9, respectively), the SoC 1502 may include some or all of a receiver (e.g., the receiver 822 or 922 of FIGS. 8 and 9, respectively). In some embodiments, the one or more dies 1504 may include a diplexer, such as the diplexer 814 of FIG. 8.

In the IC package 1500, one or more of the BAWRs 110 may be disposed outside the mold compound 1514. Although three BAWRs 110 are depicted in FIG. 15, any suitable number may be included. The IC package 1500 may also include a PA 1506 embedded in the mold compound 1514. As discussed above, the PA 1506 may serve as the PA 804 in embodiments in accordance with the RF communication circuits discussed above with reference to FIGS. 8 and 9. In the embodiment shown in FIG. 15, the PA 1506 may be a wire-bonded PA. A heat spreader 1508 may be mounted to the PA 1506. The heat spreader 1508 may be a stand-alone heat sink, or may be connected to an outer shell of a computing device in which the IC package 1500 is included (e.g., a mobile communication device) or a larger heat sink. A number of through-mold vias 1512 may be routed through the mold compound 1514 to provide electrical connections between different components of the IC package 1500 (e.g., the BAWRs 110) and/or between the IC package 1500 and other devices. The IC package 1500 may have a smaller height than other embodiments (e.g., the IC package 1300 of FIG. 13), which may be advantageous in thin device applications.

The IC package 1500 of FIG. 15 may also be formed using a laminate embedding technology. In such technology, dies may be placed onto a dielectric carrier, which is prepared with copper structures (to achieve, for example, warpage reduction and advantageous leveling), sometimes in a grid-like arrangement. The dielectric carrier may be laminated, and vias may be drilled into the laminated dielectric by laser. Redistribution and solder stop processes may be performed, and solder balls may be applied. Embodiments using such laminate embedding technologies may advantageously reduce or eliminate the need for interposers, thereby reducing the size of the IC package and reducing costs.

Figure 16:
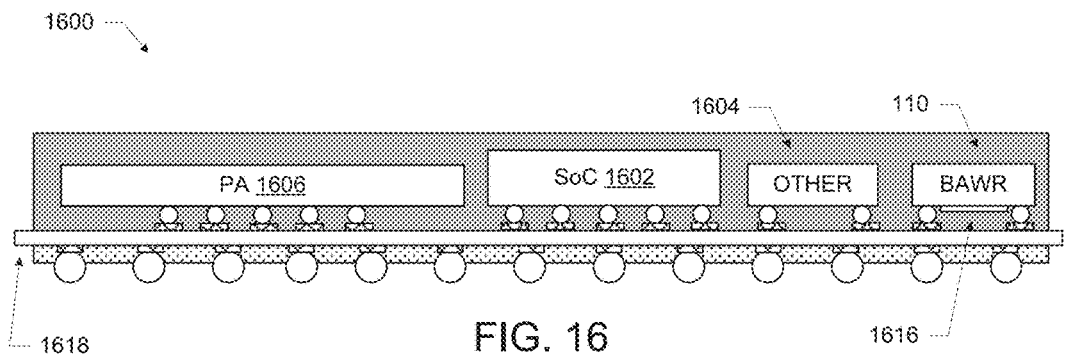
FIG. 16 is a simplified cross-sectional side view of a fifth IC package embodiment of the RF communication circuit of FIG. 1, in accordance with some embodiments.

FIG. 16 is a simplified cross-sectional side view of a fifth IC package embodiment 1600 of the RF communication circuit 100, in accordance with some embodiments. The IC package 1600 may include a flip chip structure having a system-on-a-chip (SoC) 1602, one or more BAWRs 110, and one or more dies 1604 including other circuitry (e.g., one or more inductors) arranged side-by-side. The BAWRs 110 may be mounted with a gap 1616 between the active area of a BAWR and a proximal surface to protect the active area. The IC package 1600 may also include an unpackaged PA 1606 in a flip-chip configuration, which may serve as the PA 804 in embodiments in accordance with the RF communication circuits discussed above with reference to FIGS. 8 and 9. As discussed above, in some embodiments, the SoC 1602 may include some or all of the transmitter circuit 102 and the control circuit 118. In some embodiments (e.g., the RF communication circuits 800 and 900 of FIGS. 8 and 9, respectively), the SoC 1602 may include some or all of a receiver (e.g., the receiver 822 or 922 of FIGS. 8 and 9, respectively). In some embodiments, the one or more dies 1604 may include a diplexer, such as the diplexer 814 of FIG. 8.

As shown in FIG. 16, the SoC 1602, the BAWRs 110, the PA 1606 and the dies 1604 may be mounted to a flip chip substrate 1618. After mounting, a reflow process may be performed, which may be followed by a capillary underfill and cure. In some embodiments, a molded underfill may be used.

Figure 17:
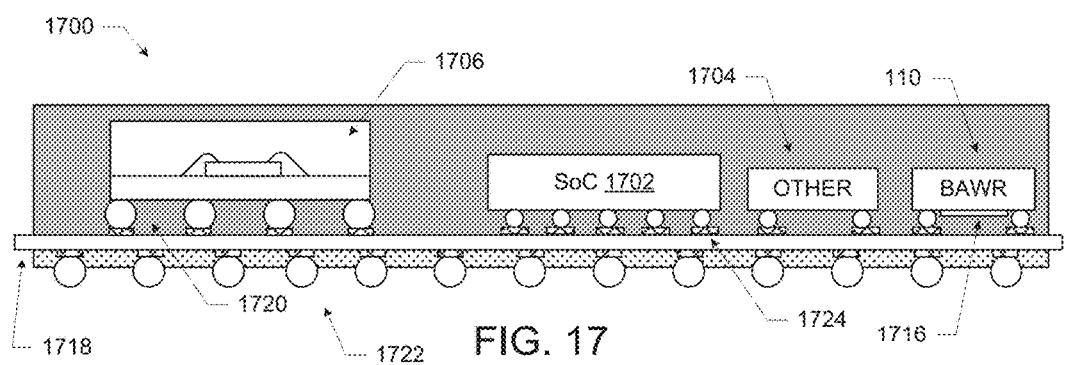
FIG. 17 is a simplified cross-sectional side view of a sixth IC package embodiment of the RF communication circuit of FIG. 1, in accordance with some embodiments.

FIG. 17 is a simplified cross-sectional side view of a fifth IC package embodiment 1700 of the RF communication circuit 100, in accordance with some embodiments. The IC package 1700 may include a flip-chip structure having a system-on-a-chip (SoC) 1702, one or more BAWRs 110, and one or more dies 1704 including other circuitry (e.g., one or more inductors) arranged side-by-side. The BAWRs 110 may be mounted with a gap 1716 between the active area of a BAWR and a proximal surface to protect the active area. The IC package 1700 may also include a packaged PA 1706, which may serve as the PA 804 in embodiments in accordance with the RF communication circuits discussed above with reference to FIGS. 8 and 9. The interconnects 1720 between the PA 1706 and the interconnectors 1722 may be ball grid array balls (in contrast with the flip-chip bumps 1724) that may interconnect the other components of the IC package 1700.

As discussed above, in some embodiments, the SoC 1702 may include some or all of the transmitter circuit 102 and the control circuit 118. In some embodiments (e.g., the RF communication circuits 800 and 900 of FIGS. 8 and 9, respectively), the SoC 1702 may include some or all of a receiver (e.g., the receiver 822 or 922 of FIGS. 8 and 9, respectively). In some embodiments, the one or more dies 1704 may include a diplexer, such as the diplexer 814 of FIG. 8. As shown in FIG. 17, the SoC 1702, the BAWRs 110, the PA 1706 and the dies 1704 may be mounted to a flip-chip substrate 1718. The IC package 1700 may be underfilled by capillary underfill and may be over-molded afterwards. A molded underfill material may be used.

Figure 18:
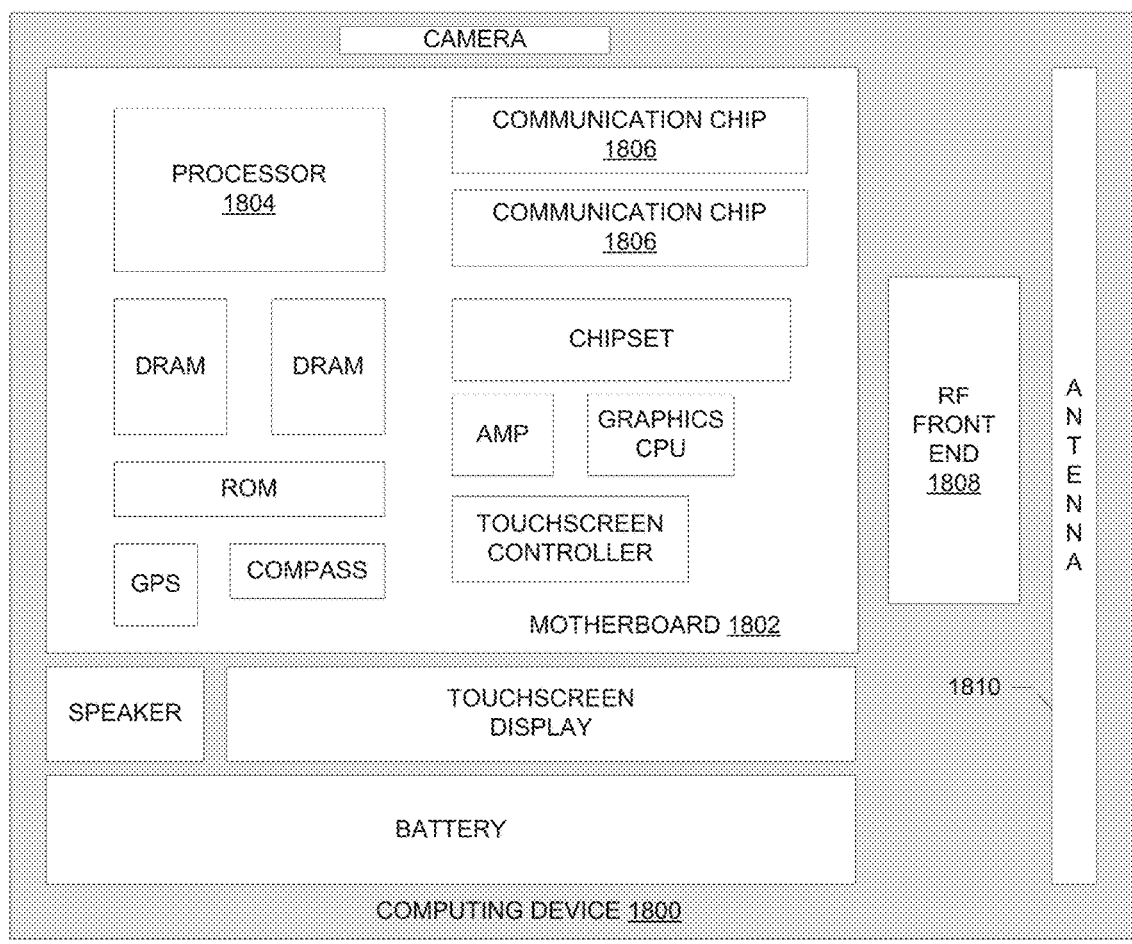
FIG. 18 schematically illustrates a mobile communication device, in accordance with some embodiments.

Embodiments of the present disclosure may be implemented into a system using any suitable hardware and/or software to configure as desired for RF communication. FIG. 18 schematically illustrates a computing device 1800 in accordance with some implementations. The computing device 1800 may be, for example, a mobile communication device. The computing device 1800 may house a board such as motherboard 1802. The motherboard 1802 may include a number of components, including but not limited to a processor 1804 and at least one communication chip 1806. The processor 1804 may be physically and electrically coupled to the motherboard 1802. In some implementations, the at least one communication chip 1806 may also be physically and electrically coupled to the motherboard 1802. In further implementations, the communication chip 1806 may be part of the processor 1804.

Depending on its applications, the computing device 1800 may include other components that may or may not be physically and electrically coupled to the motherboard 1802. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disc (CD), digital versatile disc (DVD), and so forth).

The communication chip 1806, the RF front end 1808, and the antenna 1810 may enable wireless RF communications for the transfer of data to and from the computing device 1800. The communication chip 1806 and the RF front end 1808 may include any of the RF communication circuits disclosed herein. For example, the RF front-end 1808 may include any of the PAs, filters, and/or diplexers described herein, among other components. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1806 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1806 may operate in accordance with a GSM, General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), UTRAN, or Evolved UTRAN (E-UTRAN). The communication chip 1806 may operate in accordance with CDMA, Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1806 may operate in accordance with other wireless protocols in other embodiments.

The computing device 1800 may include a plurality of communication chips 1806. For instance, a first communication chip 1806 may be dedicated to shorter range wireless communications such as Wi-Fi and Bluetooth and a second communication chip 1806 may be dedicated to longer range wireless communications such as GPS, EDGE, GPRS, CDMA, WiMAX, LTE, Ev-DO, and others. Each of the communication chips may include one or more embodiments of the RF communication circuits disclosed herein.

The processor 1804 and/or the communication chip 1806 of the computing device 1800 may include one or more dies or other components in an IC package as described herein. The term "processor" may refer to any device or portion of a device that processes electronic data from registers and/or memory to transform that electronic data into other electronic data that may be stored in registers and/or memory.

In various implementations, the computing device 1800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1800 may be any other electronic device that processes data. In some embodiments, the RF communication circuits described herein are implemented in a high-performance computing device. In some embodiments, the RF communication circuits described herein are implemented in handheld computing devices.

The following paragraphs provide a number of examples of embodiments of the present disclosure.

Example 1 is a mobile communication device, including: an antenna; a transmitter circuit having an output port; a tuner circuit having one or more bulk acoustic wave resonators (BAWRs), an antenna port coupled to the antenna, a transmitter port coupled to the output port of the transmitter circuit, and a control port; and a control circuit, coupled to the control port, configured to adjust an impedance of the tuner circuit, via adjustment of a BAWR or another component of the tuner circuit, based at least in part on an impedance of the antenna.

Example 2 may include the subject matter of Example 1, further specifying that: the transmitter circuit includes a power amplifier (PA), the PA having a supply voltage port for receiving a supply voltage, the PA having a PA output port coupled to the output port of transmitter circuit, wherein the PA output port is for outputting a current at an output power level, and wherein the PA has a peak output power based at least in part on an impedance of the tuner circuit and the antenna, as measured at the output port; and the control circuit is configured to adjust the impedance of the tuner circuit, via adjustment of a BAWR or another component of the tuner circuit, to match the peak output power of the PA to the output power level.

Example 3 may include the subject matter of Example 2, further specifying that the antenna is a first antenna, and further including: a second antenna, different from the first antenna, coupled to a receiver.

Example 4 may include the subject matter of Example 1, further specifying that: the transmitter circuit includes a diplexer having a transmitter port coupled to a transmitter, the diplexer further having a receiver port coupled to a receiver and a diplexer output port coupled to the output port of the transmitter circuit and controllably coupled to one of the transmitter port and the receiver port; and the control circuit is configured to adjust the impedance of the tuner circuit, via adjustment of a BAWR or another component of the tuner circuit, to enable a combined impedance of the tuner circuit and the antenna, as measured at the output port of the transmitter circuit, to match to an impedance of the transmitter when the diplexer output port is coupled to the transmitter port.

Example 5 may include the subject matter of any of Examples 1-4, further specifying that the control circuit is embedded in a mold compound of an embedded ball grid array structure and at least one of the BAWRs is disposed outside the mold compound.

Example 6 is a method for radio frequency communication, including: providing a tuner circuit having one or more bulk acoustic wave resonators (BAWRs), an antenna port coupled to an antenna, and a control port; and providing a control circuit, coupled to the control port, configured to adjust an impedance of the tuner circuit based at least in part on an impedance of the antenna.

Example 7 may include the subject matter of Example 6, further including adjusting the impedance of the tuner circuit, using the control circuit, based at least in part on an impedance of the antenna.

Example 8 may include the subject matter Example 6, further including providing a power amplifier (PA) having a PA output port to be coupled to the tuner circuit and configured to output a current at an output power level, wherein the PA has a peak output power based at least in part on an impedance of the tuner circuit and the antenna, as measured at the output port; wherein the control circuit is configured to adjust the impedance of the tuner circuit by adjusting a BAWR or another component of the tuner circuit to enable an impedance of the tuner circuit to match the peak output power of the PA to the output power level.

Example 9 may include the subject matter of Example 6, further including providing a diplexer having a transmitter port to be coupled to a transmitter, the diplexer further having a receiver port to be coupled to a receiver and a diplexer output port coupled to the tuner circuit and controllably coupled to one of the transmitter port and the receiver port; wherein the control circuit is configured to adjust the impedance of the tuner circuit, via adjustment of a BAWR or another component of the tuner circuit, to enable a combined impedance of the tuner circuit and the antenna, as measured at the output port of the transmitter circuit, to match an impedance of the transmitter when the diplexer output port is coupled to the transmitter port.

Example 10 is a radio frequency (RF) communication circuit, including: a radio frequency diplexer having a transmitter port to be coupled to a transmitter, a receiver port to be coupled to a receiver, and a diplexer output port to be controllably coupled to one of the transmitter port and the receiver port; a tuner circuit, coupled to the diplexer output port, having one or more bulk acoustic wave resonators (BAWRs) and one or more other components, an antenna port to be coupled to an antenna, and a control port; and a control circuit, coupled to the control port, configured to adjust an impedance of the tuner circuit via adjustment of a BAWR or other component of the tuner circuit, to enable a combined impedance of the tuner circuit and the antenna, as measured at the diplexer output port, to match an impedance of the transmitter when the diplexer output port is coupled to the transmitter port, and to match an impedance of the receiver when the diplexer output port is coupled to the receiver port.

Example 11 may include the subject matter of Example 10, further specifying that the control circuit is configured to adjust a DC voltage to be applied between two electrodes of at least one BAWR, included in the tuner circuit, to adjust the impedance of the tuner circuit.

Example 12 may include the subject matter of any of Examples 10-11, further specifying that the control circuit includes an adjustable DC voltage source configured to apply an adjustable DC voltage to adjust the capacitance of a varactor arranged in series or in parallel with at least one of the one or more BAWRs.

Example 13 may include the subject matter of any of Examples 10-12, further specifying that the control circuit includes a signal source configured to apply electrical signals to adjust the capacitance of a microelectromechanical systems (MEMS) capacitor arranged in series or in parallel with at least one of the one or more BAWRs.

Example 13a may include the subject matter of Example 10, wherein the control circuit and at least one of the BAWRs are embedded in a mold compound of an embedded ball grid array structure.

Example 14 may include the subject matter of any of Examples 10-14, further specifying that the control circuit is embedded in a mold compound of an embedded ball grid array structure and at least one of the BAWRs is disposed outside the mold compound.

Example 15 may include the subject matter of any of Examples 10-14, further including a power amplifier (PA) to be coupled between the transmitter and the transmitter port; wherein the control circuit is embedded in a mold compound of an embedded ball grid array structure and the PA is disposed outside the mold compound.

Example 16 may include the subject matter of any of Examples 10-14, further including a power amplifier (PA) to be coupled between the transmitter and the transmitter port; wherein the control circuit and the PA are embedded in a mold compound of an embedded ball grid array structure.

Example 17 is a radio frequency (RF) communication circuit, including: a tuner circuit having one or more bulk acoustic wave resonators (BAWRs), an antenna port to be coupled to a transmit antenna, a signal port, and a control port; a power amplifier (PA) having an output port, coupled to the signal port, and configured to output a current at an output power level, wherein the PA has a peak output power based at least in part on an impedance of the tuner circuit and the antenna, as measured at the output port; and a control circuit, coupled to the control port, configured to adjust an impedance of the tuner circuit to match the peak output power of the PA to the output power level.

Example 18 may include the subject matter of Example 17, further specifying that no diplexer is interposed between the PA and the tuner circuit.

Example 19 may include the subject matter of any of Examples 17-18, further specifying that the RF communication circuit is included in a mobile communication device and the output power level is based at least in part on a distance between the mobile communication device and a base station in communication with the mobile communication device.

Example 20 may include the subject matter of any of Examples 17-19, further specifying that the control circuit is configured to provide a DC voltage to be applied between two electrodes of at least one BAWR, included in the tuner circuit, to adjust the impedance of the tuner circuit.

Example 21 may include the subject matter of any of Examples 17-20, further specifying that the control circuit includes an adjustable DC voltage source configured to apply an adjustable DC voltage to adjust the capacitance of a varactor arranged in series or in parallel with at least one of the one or more BAWRs.

Example 22 may include the subject matter of any of Examples 17-21, further specifying that the control circuit includes a signal source configured to apply electrical signals to adjust the capacitance of a microelectromechanical systems (MEMS) capacitor arranged in series or in parallel with at least one of the one or more BAWRs.

Example 23 may include the subject matter of any of Examples 17-22, further specifying that the PA and at least one of the BAWRs are packaged side-by-side in a flip-chip structure.

Example 24 may include the subject matter of any of Examples 17-22, further specifying that the control circuit is embedded in a mold compound of an embedded ball grid array structure, and the PA and at least one of the BAWRs are disposed outside the mold compound.

Example 25 may include the subject matter of any of Examples 17-23, further specifying that the PA is included in a wire bonded package.

The above description of illustrated implementations, including what is described in the Abstract, is not intended to be exhaustive or to limit the disclosure to the precise forms disclosed. While specific implementations are described herein for illustrative purposes, various equivalent modifications are possible within the scope of the disclosure, as those skilled in the relevant art will recognize.

These modifications may be made to the disclosed embodiments in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A mobile communication device, comprising:
   a first antenna;
   a transmitter circuit having an output port;
   a tuner circuit having one or more bulk acoustic wave resonators (BAWRs), an antenna port coupled to the first antenna, a transmitter port coupled to the output port of the transmitter circuit, and a control port; and
   a control circuit, coupled to the control port, configured to adjust an impedance of the tuner circuit, via adjustment of a BAWR or another component of the tuner circuit, based at least in part on an impedance of the first antenna; and
   a second antenna, different from the first antenna, coupled to a receiver.

2. The mobile communication device of claim 1, wherein:
   the transmitter circuit comprises a power amplifier (PA), the PA having a supply voltage port for receiving a supply voltage, the PA having a PA output port coupled to the output port of the transmitter circuit, wherein the PA output port is for outputting a current at an output power level, and wherein the PA has a peak output power based at least in part on an impedance of the tuner circuit and the first antenna, as measured at the output port; and
   the control circuit is configured to adjust the impedance of the tuner circuit, via adjustment of a BAWR or another component of the tuner circuit, to match the peak output power of the PA to the output power level.

3. The mobile communication device of claim 1, wherein:
   the transmitter circuit comprises a diplexer having a transmitter port coupled to a transmitter, the diplexer further having a receiver port coupled to a receiver and a diplexer output port coupled to the output port of the transmitter circuit and controllably coupled to one of the transmitter port and the receiver port; and
   the control circuit is configured to adjust the impedance of the tuner circuit, via adjustment of a BAWR or another component of the tuner circuit, to enable a combined impedance of the tuner circuit and the first antenna, as measured at the output port of the transmitter circuit, to match to an impedance of the transmitter when the diplexer output port is coupled to the transmitter port.

4. The mobile communication device of claim 1, wherein the control circuit is embedded in a mold compound of an embedded ball grid array structure and at least one of the BAWRs is disposed outside the mold compound.

5. A method for radio frequency communication, comprising:
   providing a tuner circuit having one or more bulk acoustic wave resonators (BAWRs), an antenna port coupled to an antenna, and a control port;
   providing a control circuit, coupled to the control port, configured to adjust an impedance of the tuner circuit based at least in part on an impedance of the antenna; and
   providing a diplexer having a transmitter port to be coupled to a transmitter, the diplexer further having a receiver port to be coupled to a receiver and a diplexer output port coupled to the tuner circuit and controllably coupled to one of the transmitter port and the receiver port;
   wherein the control circuit is configured to adjust the impedance of the tuner circuit, via adjustment of a BAWR or another component of the tuner circuit, to enable a combined impedance of the tuner circuit and the antenna, as measured at the output port of the transmitter, to match an impedance of the transmitter when the diplexer output port is coupled to the transmitter port.

6. The method of claim 5, further comprising:
   adjusting the impedance of the tuner circuit, using the control circuit, based at least in part on an impedance of the antenna.

7. The method of claim 5, further comprising:
   providing a power amplifier (PA) having a PA output port to be coupled to the tuner circuit and configured to output a current at an output power level, wherein the PA has a peak output power based at least in part on an impedance of the tuner circuit and the antenna, as measured at the output port;
   wherein the control circuit is configured to adjust the impedance of the tuner circuit by adjusting a BAWR or another component of the tuner circuit to enable an impedance of the tuner circuit to match the peak output power of the PA to the output power level.

8. A radio frequency (RF) communication circuit, comprising:
   a radio frequency diplexer having a transmitter port to be coupled to a transmitter, a receiver port to be coupled to a receiver, and a diplexer output port to be controllably coupled to one of the transmitter port and the receiver port;
   a tuner circuit, coupled to the diplexer output port, having one or more bulk acoustic wave resonators (BAWRs) and one or more other components, an antenna port to be coupled to an antenna, and a control port; and
   a control circuit, coupled to the control port, configured to adjust an impedance of the tuner circuit via adjustment of a BAWR or other component of the tuner circuit, to enable a combined impedance of the tuner circuit and the antenna, as measured at the diplexer output port, to match an impedance of the transmitter when the diplexer output port is coupled to the transmitter port, and to match an impedance of the receiver when the diplexer output port is coupled to the receiver port.

9. The RF communication circuit of claim 8, wherein the control circuit is configured to adjust a DC voltage to be applied between two electrodes of at least one BAWR, included in the tuner circuit, to adjust the impedance of the tuner circuit.

10. The RF communication circuit of claim 8, wherein the control circuit comprises an adjustable DC voltage source configured to apply an adjustable DC voltage to adjust a capacitance of a varactor arranged in series or in parallel with at least one of the one or more BAWRs.

11. The RF communication circuit of claim 8, wherein the control circuit comprises a signal source configured to apply electrical signals to adjust a capacitance of a microelectromechanical systems (MEMS) capacitor arranged in series or in parallel with at least one of the one or more BAWRs.

12. The RF communication circuit of claim 8, wherein the control circuit is embedded in a mold compound of an embedded ball grid array structure and at least one of the BAWRs is disposed outside the mold compound.

13. The RF communication circuit of claim 8, further comprising:
a power amplifier (PA) to be coupled between the transmitter and the transmitter port;
wherein the control circuit is embedded in a mold compound of an embedded ball grid array structure and the PA is disposed outside the mold compound.

14. The RF communication circuit of claim 8, further comprising:
a power amplifier (PA) to be coupled between the transmitter and the transmitter port;
wherein the control circuit and the PA are embedded in a mold compound of an embedded ball grid array structure.

15. A radio frequency (RF) communication circuit, comprising:
a tuner circuit having one or more bulk acoustic wave resonators (BAWRs), an antenna port to be coupled to a transmit antenna, a signal port, and a control port;
a power amplifier (PA) having an output port, coupled to the signal port, and configured to output a current at an output power level, wherein the PA has a peak output power based at least in part on an impedance of the tuner circuit and the antenna, as measured at the output port; and
a control circuit, coupled to the control port, configured to adjust an impedance of the tuner circuit to match the peak output power of the PA to the output power level;
wherein the control circuit is embedded in a mold compound of an embedded ball grid array structure, and the PA and at least one of the BAWRs are disposed outside the mold compound.

16. The RF communication circuit of claim 15, wherein no diplexer is interposed between the PA and the tuner circuit.

17. The RF communication circuit of claim 15, wherein the RF communication circuit is included in a mobile communication device and the output power level is based at least in part on a distance between the mobile communication device and a base station in communication with the mobile communication device.

18. The RF communication circuit of claim 15, wherein the control circuit is configured to provide a DC voltage to be applied between two electrodes of at least one BAWR, included in the tuner circuit, to adjust the impedance of the tuner circuit.

19. The RF communication circuit of claim 15, wherein the control circuit comprises an adjustable DC voltage source configured to apply an adjustable DC voltage to adjust the capacitance of a varactor arranged in series or in parallel with at least one of the one or more BAWRs.

20. The RF communication circuit of claim 15, wherein the control circuit comprises a signal source configured to apply electrical signals to adjust the capacitance of a microelectromechanical systems (MEMS) capacitor arranged in series or in parallel with at least one of the one or more BAWRs.

21. The RF communication circuit of claim 15, wherein the PA and at least one of the BAWRs are packaged side-by-side in a flip-chip structure.

22. The RF communication circuit of claim 15, wherein the PA is included in a wire bonded package.

* * * * *